United States Patent
Yin et al.

(10) Patent No.: US 9,532,473 B2
(45) Date of Patent: Dec. 27, 2016

(54) DUAL FUNCTION MAGNETIC DOOR COVER

(71) Applicant: Honeywell International Inc., Morristown, NJ (US)

(72) Inventors: Glen Yin, Shanghai (CN); Xiongji Cheng, Shanghai (CN); Sean Yu, Shanghai (CN)

(73) Assignee: HONEYWELL INTERNATIONAL INC., Morristown, NJ (US)

( * ) Notice: Subject to any disclaimer, the term of this patent is extended or adjusted under 35 U.S.C. 154(b) by 28 days.

(21) Appl. No.: 14/546,021

(22) Filed: Nov. 18, 2014

(65) Prior Publication Data

US 2016/0143163 A1  May 19, 2016

(51) Int. Cl.
| | |
|---|---|
| H05K 5/00 | (2006.01) |
| H05K 5/02 | (2006.01) |
| H05K 5/03 | (2006.01) |
| H01H 13/18 | (2006.01) |
| H01H 21/28 | (2006.01) |
| H01H 36/00 | (2006.01) |

(52) U.S. Cl.
CPC .......... *H05K 5/0221* (2013.01); *H01H 13/183* (2013.01); *H01H 21/282* (2013.01); *H01H 36/0046* (2013.01); *H05K 5/0247* (2013.01); *H05K 5/0256* (2013.01); *H05K 5/0286* (2013.01); *H05K 5/03* (2013.01)

(58) Field of Classification Search
USPC .......................... 361/728–730, 752, 796, 755
See application file for complete search history.

(56) References Cited

U.S. PATENT DOCUMENTS

| | | | |
|---|---|---|---|
| 4,872,139 A | 10/1989 | Okamoto et al. | |
| 4,889,209 A * | 12/1989 | Sears | G10K 11/16 181/200 |
| 5,220,552 A * | 6/1993 | Yokoi | G11B 33/027 360/99.02 |
| 5,530,302 A | 6/1996 | Hamre et al. | |
| 5,574,625 A * | 11/1996 | Ohgami | G06F 1/1626 312/223.2 |
| 6,491,226 B1 | 12/2002 | Nishioka | |
| 7,350,219 B2 * | 3/2008 | Liao | G11B 17/0405 720/647 |

(Continued)

FOREIGN PATENT DOCUMENTS

EP  0 947 836 A2  10/1999

OTHER PUBLICATIONS

The extended European search report from corresponding EP patent application 15193993.1, dated Mar. 29, 2016.

*Primary Examiner* — Hung S Bui
(74) *Attorney, Agent, or Firm* — Husch Blackwell LLP

(57) ABSTRACT

An electrical product includes a housing with a movable cover and at least one module receiving slot that can be closed by the cover. The housing carries control circuits. A proximity switch is carried on the module. When the module is inserted into the slot and the cover is closed, an electrical signal can be coupled to the control circuits in the product. When the cover is opened, a different signal can be coupled to the control circuits in the product. A first latch element can be carried on the housing, adjacent to the slot, to retain the cover in the closed state. A second latch element releasibly engages the first latch element when the cover is closed.

19 Claims, 2 Drawing Sheets

(56) References Cited

U.S. PATENT DOCUMENTS

| | | | |
|---|---|---|---|
| 7,738,254 B2* | 6/2010 | Oyama | G11B 33/128 361/725 |
| 7,855,346 B2* | 12/2010 | Okada | G03G 15/5016 200/333 |
| 8,435,054 B2* | 5/2013 | Liu | H01R 13/447 439/142 |
| 2009/0289063 A1* | 11/2009 | Fullerton | H04M 1/0262 220/230 |
| 2010/0243290 A1 | 9/2010 | Kato | |

* cited by examiner

DUAL FUNCTION MAGNETIC DOOR COVER

FIELD

The application pertains to electrical devices that support, and can receive optional function providing modules. More particularly the application pertains to such devices that include access ports for various types of modules, wherein a respective device receives an alert signal in connection with adding, removing or changing modules.

BACKGROUND

Many electronic products or units include optional, function providing modules, such as GSM modules, 4G modules and the like all without limitation. These modules need to be easy to install or replace in the respective product by the end user or customer service engineers.

Plug and play type functionality with energized products may not be supported when these optional modules need to be plugged in or removed from the respective product. Instead, a signal is needed to notify the product or system to backup data or carry out other house-keeping activities. To implement this function, it is known to add a switch with a cable or carried on a PCB. When an access door is opened or closed, a signal will be communicated to the product or system.

DETAILED DESCRIPTION

Figure 1:
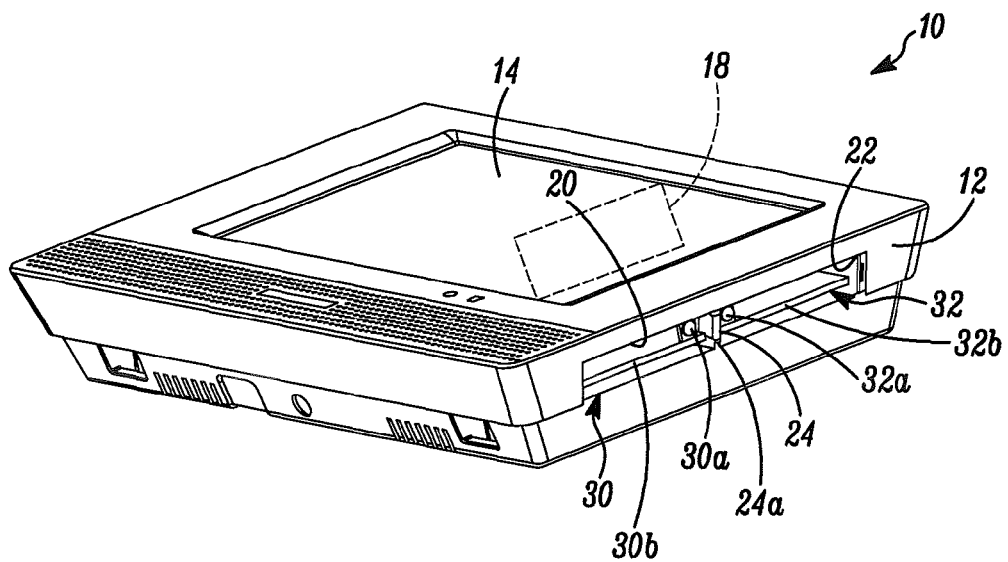
FIG. 1 illustrates a representative electrical product in accordance herewith.

While disclosed embodiments can take many different forms, specific embodiments thereof are shown in the drawings and will be described herein in detail with the understanding that the present disclosure is to be considered as an exemplification of the principles thereof, as well as the best mode of practicing the same, and is not intended to limit the application or claims to the specific embodiment illustrated.

In one aspect hereof, a magnet or magnetic element can be added to an access door of an electronic product or unit. A magnetically responsive proximity switch, for example, one with a Hall effect sensor, can be mounted on a printed circuit board of an optional function extending module. The added magnet, in combination with the switch, generates a signal when the magnetic cover is opened or closed.

A secondary function of the magnet is to support or fix the door cover in place. The magnetic door cover can be easily opened, closed, removed or assembled by an end user. A sheet metal clip carried in the product can retain the magnetic cover in a closed position.

The magnetic element can include one or more magnets embedded in a resin or plastic material. The element can have an elongated shape and be long enough to extend across multiple switches. It will also be understood that a variety of proximity switches could be used without departing from the spirit and scope hereof. These include, without limitation, capacitive, optical or acousticly actuated switches.

FIGS. 1-5 illustrate aspects of embodiments hereof. An electrical product 10 incudes a housing 12 with a display 14. Control circuits 18 are carried within the housing 12, illustrated in phantom in FIG. 1.

The product 10 can implement a set of functions as would be understood by those of skill in the art. To supplement or expand on such functionality, slots 20, 22 are defined in the housing 12 to receive optional, replacable modules such as modules 30, 32.

The modules 30, 32 can include control circuitry, as would be understood by those of skill in the art, to carry out a predetermined function, as well as a proximity switch, such as 30a, 32a. Each of the switches 30a, 32a is carried on a respective printed circuit board 30b, 32b. The pairs of slots and modules, such as 20, 22 and 30, 32, can have common form factors so that a given module could be inserted into either slot if desired.

Figure 2:
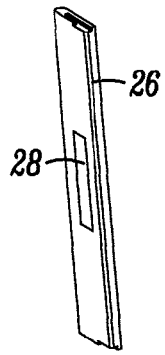
FIG. 2 is a view of an access door usable with the product of FIG. 1.

A metal clip 24 is located between the slots 20, 22 to retain a door 26, see FIG. 2, in a closed state. A magnetic element 28 can be carried by the door 26, as illustrated in FIG. 2.

Figure 3:
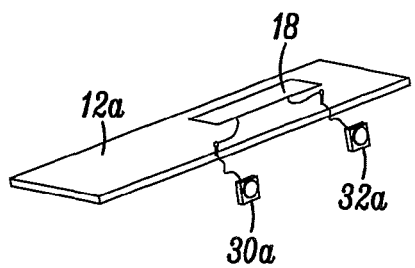
FIG. 3 illustrates an alternate embodiment hereof.

In another embodiment, instead of carrying the switches, such as 30a, 32a, on the respective modules, such as 30, 32, the can be carried on a printed circuit, or mother board, 12a, as illustrated in FIG. 3. In this embodiment, the board 12a can also carry the control circuits 18.

Figure 4:
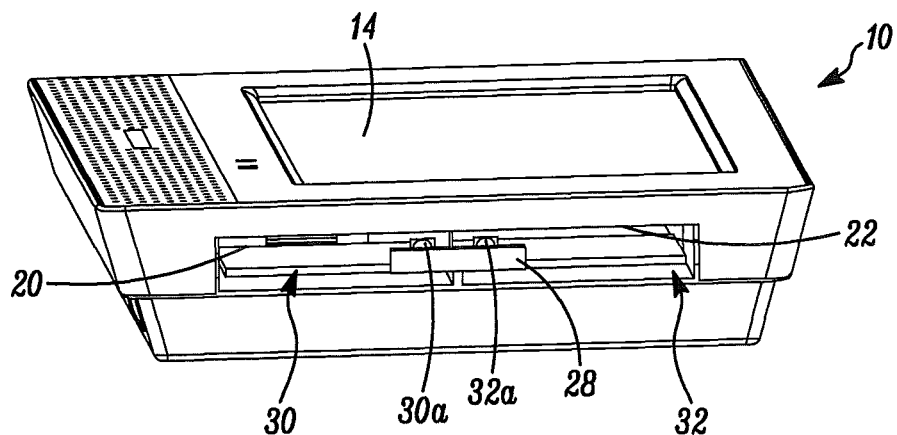
FIG. 4 is a view of an exemplary product with the door closed and rendered so as to be transparent.

FIG. 4 illustrates the aspects of the product 10 with the door 26 closed against the modules 30, 32. In the illustration of FIG. 4, the door 26 is rendered transparent so that the relationship between the magnetic element 28 and the switches 30a, 32a (when the door 26 is closed) can be seen.

The embedded magnet 28 is elongated with a length long enough to simultaneously overlay both of the magnetic proximity switches 30a, 32a when the door 26 is closed. This, in turn, causes both of the switches 30a, 32a to exhibit a first state.

When the door 26 is opened, both of the switches 30a, 32a exhibit a second, door open state. Signals indicative of the door closed state and the door open state can be coupled to the control circuits 18 to provide condition indicating feedback to the product 10.

Figure 5:
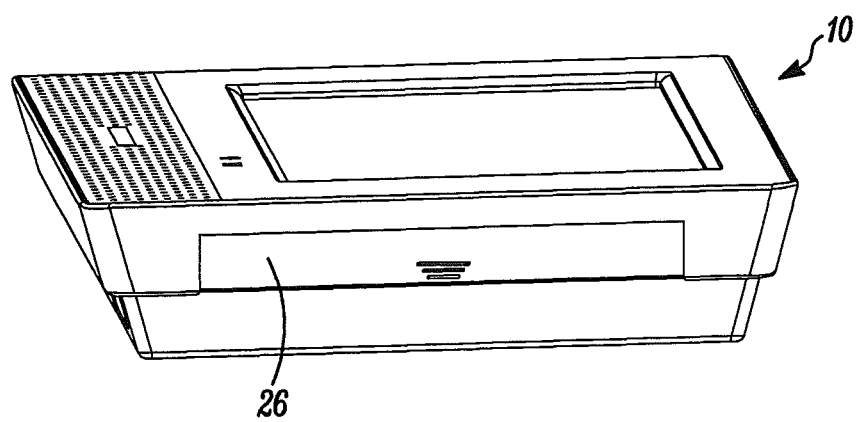
FIG. 5 is a view of the product of FIG. 4 with the door closed and not transparent.

In FIG. 5, the door 26 is illustrated in a closed state. In the state of the door 26, as in FIG. 5, the magnetic element 28 is attracted to the metal clip 24 to latch the door closed against the product 10.

From the foregoing, it will be observed that numerous variations and modifications may be effected without departing from the spirit and scope hereof. It is to be understood that no limitation with respect to the specific apparatus illustrated herein is intended or should be inferred. It is, of course, intended to cover by the appended claims all such modifications as fall within the scope of the claims. Further, logic flows depicted in the figures do not require the particular order shown or sequential order to achieve desirable results. Other steps may be provided or steps may be eliminated from the described flows, and other components may be added to or removed from the described embodiments.

The invention claimed is:

1. An electrical device comprising:
   a housing defining an interior region bounded at least in part, by a movable cover;
   at least first and second receiver slots defined on the housing adjacent to the movable cover;

a first proximity switch that indicates when the movable cover is in a closed position;
a latch element located adjacent to at least one of the first and second receiver slots, wherein the movable cover carries a selected region configured to cause a change of state of the first proximity switch when the movable cover is in the closed position; and
a second proximity switch;
wherein a first module is located in the first receiver slot and a second module is located in the second receiver slot, and wherein movement of the movable cover communicates a change of state of the first proximity switch and the second proximity switch to control circuits carried by the housing.

2. The device as in claim 1 wherein the latch element releasibly retains the movable cover carried on the housing in the closed position.

3. The device as in claim 2 wherein the selected region is a magnet, and wherein the latch element comprises a metal member to which the selected region is releasibly attached.

4. The device as in claim 2 wherein the control circuits, carried in the housing, are at least intermittently coupled to the first proximity switch and responsive to the change of state thereof.

5. The device as in claim 4 wherein the first proximity switch is carried by a module, separate from the housing, that can be received in one of the first and second receiver slots.

6. The device as in claim 5 wherein the change of state of the first proximity switch is coupled to the control circuits carried in the housing.

7. The device as in claim 6 wherein the movable cover causes a different change of state of the first proximity switch when the movable cover is in an open position, and wherein the different change of state is detected by the control circuits.

8. The device as in claim 7 wherein the first proximity switch is selected from a class including at least a magnetic proximity switch, a capacitive proximity switch, an optical proximity switch and an inductive proximity switch.

9. The device as in claim 1 wherein the first proximity switch is carried by a module, separate from the housing, that can be received in one of the first and second receiver slots.

10. The device as in claim 1 wherein the first and second proximity switches are selected from a class including at least a magnetic proximity switch, a capacitive proximity switch, an optical proximity switch and an inductive proximity switch.

11. The device as in claim 1 wherein the latch element comprises a metal member to which the selected region is releasibly attached.

12. The device as in claim 11 wherein the selected region is elongated and causes the change of state in the first and second proximity switches at substantially a same time.

13. A product comprising:
a housing with a movable cover and a first module receiving slot that is closed by the movable cover;
control circuits carried by the housing;
a proximity switch that is carried on an insertable module, wherein, when the insertable module is inserted into the first module receiving slot, and when the movable cover is in a closed state, the proximity switch communicates a first electrical signal to the control circuits indicating the movable cover is in the closed state, and, when the movable cover is in an opened state, the proximity switch communicates a second electrical signal to the control circuits indicating that the movable cover is in the opened state;
a first latch element carried on the housing, adjacent to the first module receiving slot to retain the movable cover in the closed state; and
a second latch element that releasibly engages the first latch element when the movable cover is in the closed state.

14. The product as in claim 13 wherein one of the first and second latch elements comprises a magnetic member embedded in the movable cover.

15. The product as in claim 14 wherein the movable cover is rotatably attached to the housing so that, when the movable cover is in the opened state, the insertable module is inserted into the first module receiving slot and so that, when the movable cover is rotated into the closed state, the first and second latch elements retain the movable cover in the closed state.

16. The product as in claim 15 wherein the housing includes a second module receiving slot.

17. The product as in claim 16 wherein one of the first and second latch elements is located between the first and second module receiving slots.

18. The product as in claim 17 wherein the magnetic member is elongated and is long enough to extend across portions of both of the first and second module receiving slots.

19. The product as in claim 18 further comprising two modules, each of the two modules inserted into a respective one of the first and second module receiving slots wherein, as the movable cover is closed, the magnetic member causes multiple proximity switches to change state substantially at a same time.

* * * * *